(12) United States Patent
Ishida et al.

(10) Patent No.: US 10,781,410 B2
(45) Date of Patent: Sep. 22, 2020

(54) COMPOSITION FOR SURFACE TREATMENT AND METHOD FOR SURFACE TREATMENT USING THE SAME

(71) Applicant: FUJIMI INCORPORATED, Aichi (JP)

(72) Inventors: Yasuto Ishida, Aichi (JP); Tsutomu Yoshino, Aichi (JP); Shogo Onishi, Aichi (JP)

(73) Assignee: FUJIMI INCORPORATED (JP)

( * ) Notice: Subject to any disclaimer, the term of this patent is extended or adjusted under 35 U.S.C. 154(b) by 142 days.

(21) Appl. No.: 16/127,536

(22) Filed: Sep. 11, 2018

(65) Prior Publication Data
US 2019/0085271 A1    Mar. 21, 2019

(30) Foreign Application Priority Data
Sep. 19, 2017    (JP) .................................. 2017-179296

(51) Int. Cl.
| | | |
|---|---|---|
| *C11D 3/60* | (2006.01) | |
| *C11D 7/32* | (2006.01) | |
| *C11D 11/00* | (2006.01) | |
| *C11D 7/34* | (2006.01) | |
| *C11D 7/26* | (2006.01) | |
| *H01L 21/02* | (2006.01) | |
| *C11D 3/37* | (2006.01) | |
| *H01L 21/3105* | (2006.01) | |

(52) U.S. Cl.
CPC ............ *C11D 7/3245* (2013.01); *C11D 3/378* (2013.01); *C11D 7/265* (2013.01); *C11D 7/34* (2013.01); *C11D 11/0047* (2013.01); *H01L 21/02065* (2013.01); *H01L 21/02068* (2013.01); *H01L 21/31053* (2013.01)

(58) Field of Classification Search
CPC ................................................... C11D 11/0047
USPC ........................................................ 510/175
See application file for complete search history.

(56) References Cited

U.S. PATENT DOCUMENTS

| | | | | |
|---|---|---|---|---|
| 2011/0136717 A1* | 6/2011 | Tamboli | ................... | C11D 3/30 510/176 |
| 2015/0140820 A1 | 5/2015 | Kawada et al. | | |

FOREIGN PATENT DOCUMENTS

JP    WO2013/162020 A1    10/2013

\* cited by examiner

*Primary Examiner* — Gregory E Webb
(74) *Attorney, Agent, or Firm* — Katten Munchin Rosenman LLP

(57) ABSTRACT

The composition for surface treatment according to the present invention includes a carboxylic acid compound having two or more nitrogen atoms, an ionic dispersing agent, and water, has a pH of less than 6, and is used for treating a surface of a polished object having a tungsten-containing layer.

10 Claims, No Drawings

COMPOSITION FOR SURFACE TREATMENT AND METHOD FOR SURFACE TREATMENT USING THE SAME

CROSS-REFERENCE TO RELATED APPLICATION

The present patent application is based on Japanese Patent Application No. 2017-179296, filed on Sep. 19, 2017, the entire disclosure of which is incorporated herein by reference.

BACKGROUND

1. Technical Field

The present invention relates to a composition for surface treatment, and a method for surface treatment using the same.

2. Description of Related Arts

In recent years, in accordance with multilayer wiring on a surface of a semiconductor substrate, a so-called chemical mechanical polishing (CMP) technique which physically polishes and flattens a semiconductor substrate in the production of a device is used. CMP is a method for flattening the surface of a polishing object (an object to be polished) such as a semiconductor substrate, using a polishing composition (slurry) containing abrasive grains such as silica, alumina, or ceria, an anticorrosive, a surfactant, and the like. The polishing object is silicon, polysilicon, silicon oxide, silicon nitride, a wiring or a plug formed of metal, or the like.

On the surface of a semiconductor substrate after a CMP process, impurities (foreign substances) are present in a large amount. The impurities include abrasive grains, metals, anticorrosives, and organic materials such as surfactants which are derived from a polishing composition used for CMP, silicon-containing materials which are a polishing object, silicon-containing materials or metals produced by polishing a metal wiring or plug, and organic materials such as pad debris produced from various pads.

The surface of a semiconductor substrate which is contaminated with those impurities may adversely affect the electrical properties of a semiconductor, thereby reducing the reliability of the device. Therefore, it is preferred to introduce a cleaning step after a CMP process, and remove these impurities from the surface of a semiconductor substrate.

As a cleaning agent (cleaning composition) used in such a cleaning step, for example, WO 2013/162020 A1 (corresponding to US 2015/140820 A1) suggests a cleaning composition for a semiconductor substrate containing a phosphonic acid-based chelating agent, predetermined monoamine, and water, and having a pH of more than 6 and less than 7. In addition, this document discloses that the cleaning composition can remove foreign substances (polishing fine particles), without corroding the surface of the substrate (tungsten wiring or tungsten alloy wiring).

SUMMARY

However, there is needed a technique to further improve a corrosion (dissolution) inhibition effect of a tungsten layer, when cleaning a polished object having a tungsten-containing layer (tungsten layer) on the surface.

The present invention has been made in view of the above problems, and an object of the present invention is to provide a means for suppressing dissolution of a tungsten-containing layer provided on a polished object, when performing surface treatment.

The inventors of the present invention conducted an intensive study considering the above problems, and as a result, have found that the above problems are solved by using a composition for surface treatment including a predetermined carboxylic acid compound; an ionic dispersing agent; and water, and having a predetermined range of pH, thereby completing the present invention.

That is, one embodiment for solving the above problems of the present invention is a composition for surface treatment including a carboxylic acid compound having 2 or more nitrogen atoms, an ionic dispersing agent, and water, having a pH less than 6, and being used for treating the surface of a polished object having a tungsten-containing layer.

DETAILED DESCRIPTION

Hereinafter, the embodiments of the present invention are described. Further, the present invention is not limited only to the following embodiments. In addition, unless particularly stated herein, operation and measurement of physical properties and the like are carried out under the condition of room temperature (20° C. to 25° C.)/relative humidity of 40% RH to 50% RH.

A composition for surface treatment according to an embodiment of the present invention is used for treating the surface of a polished object having a tungsten-containing layer. In the present description, the term "surface treatment" has a concept including for example, cleaning treatment and rinse polishing treatment for a polished object, as described below. Therefore, the composition for surface treatment according to an embodiment of the present invention is used as a cleaning composition or a rinse polishing composition.

Further, in the present description, the term "tungsten-containing layer" may be simply referred to as "tungsten layer" or "W layer", the term "polished object having a tungsten-containing layer" may be simply referred to as "polished object", and the term "composition for surface treatment according to an embodiment of the present invention" may be simply referred to as "composition for surface treatment".

A cleaning step performed after a chemical mechanical polishing (CMP) process is intended to remove impurities (foreign substances such as particles, metal contaminants, organic residues, or pad debris) remaining on the surface of a semiconductor substrate (polished object). Here, for example, the foreign substances can be removed by cleaning the semiconductor substrate (polished object) using a cleaning agent disclosed in for example, WO 2013/162020 A1 (corresponding to US 2015/140820 A1). However, the present inventors conducted an intensive study for further improving an effect of suppressing dissolution of a tungsten layer, when cleaning a polished object having a tungsten layer using a cleaning agent. As a result, they found out that when the surface treatment is performed by the composition for surface treatment according to an embodiment of the present invention, the dissolution of a tungsten layer provided on the surface of the polished object can be effectively suppressed.

The composition for surface treatment according to an embodiment of the present invention includes a carboxylic acid compound having two or more nitrogen atoms, an ionic dispersing agent, and water, has a pH less than 6, and is used for treating the surface of a polished object having a tungsten-containing layer.

The present inventors assume the mechanism to solve the problems by the present invention, as follows.

It is considered that a tungsten layer dissolves since the tungsten layer which is provided on the surface of a polished object forms a hydrate ($W_xO_y^{A-}$) with water contained in a cleaning agent (a composition used in cleaning), thereby becoming easily dissolved. Such dissolution of a tungsten layer becomes more pronounced when the pH is high (that is, alkaline), or the potential of the polished object is high.

However, since the composition for surface treatment according to an embodiment of the present invention includes a carboxylic acid compound having two or more nitrogen atoms, it is considered that the carboxylic acid compound is adsorbed on the tungsten layer to protect the surface of the layer. Specifically, the carboxylic acid compound according to the present invention has two or more nitrogen atoms, and coordinated to the surface of the tungsten layer by the nitrogen atoms. It is supposed that as these nitrogen atoms stably coordinate to the tungsten layer together with a carboxyl group (—$CO_2H$), an insoluble complex is formed on the surface of the tungsten layer, and as a result, hydration is suppressed, and the carboxylic acid compound can serve as an inhibitor to suppress the dissolution (dissolution inhibitor) of a tungsten layer.

In addition, since the composition for surface treatment according to an embodiment of the present invention has a pH less than 6 (acidic), it is considered that the composition can suppress the dissolution of a tungsten layer which is pronounced at high pH.

Furthermore, the ionic dispersing agent included in the composition for surface treatment according to an embodiment of the present invention is adsorbed on the surface of the tungsten layer together with the carboxylic acid compound, thereby increasing an effect of further suppressing the dissolution of the tungsten layer, and also, the ionic dispersing agent also contributes to the removal of the foreign substances (impurities including organic residues and the like) by the composition for surface treatment. Therefore, the composition for surface treatment including the ionic dispersing agent also represents an effect of sufficiently removing the foreign substances remaining on the surface of the polished object, in the surface treatment (such as cleaning) of the polished object.

Therefore, according to the present invention, the dissolution of the tungsten-containing layer provided on the polished object can be suppressed, while maintaining a sufficient cleaning ability (ability to remove foreign substances), when performing surface treatment. That is, according to the present invention, a means for suppressing the dissolution of the tungsten-containing layer provided on the polished object, when performing surface treatment, is provided. The mechanism is based on an assumption, and whether it is correct or incorrect has no influence on the technical scope of the present invention.

<Composition for Surface Treatment>

Hereinafter, each component included in the composition for surface treatment is described.

[Carboxylic Acid Compound Having Two or More Nitrogen Atoms]

The composition for surface treatment according to an embodiment of the present invention includes a carboxylic acid compound having two or more nitrogen atoms (herein also simply referred to as "a carboxylic acid compound").

The carboxylic acid compound contributes to the dissolution suppression of a tungsten layer, as described above. That is, the carboxylic acid compound according to the present invention functions as a dissolution inhibitor which suppresses the dissolution of a tungsten layer, or the like (hereinafter, also simply referred to as "inhibitor" or "suppressor").

The carboxylic acid compound is not particularly limited as long as it is a compound having two or more nitrogen atoms and one or more carboxyl groups (—$CO_2H$). The carboxyl group in the composition for surface treatment may be included in a salt form (—$CO_2M^1$, wherein $M^1$ is an organic or inorganic cation).

The number of nitrogen atoms in the carboxylic acid compound according to the present invention is two or more. The larger the number of the nitrogen atoms, the easier the coordination of the carboxylic acid compound to the tungsten layer, which is preferred for suppressing the dissolution of the tungsten layer, or the like. In this regard, the carboxylic acid compound has preferably 3 or more, and more preferably 4 or more nitrogen atoms. Meanwhile, the upper limit of the number of the nitrogen atoms is not particularly limited, but from the viewpoint of easily removing the carboxylic acid compound itself from the tungsten layer after surface treatment, it is preferably 8 or less, more preferably 7 or less, and particularly preferably 6 or less. In addition, for balancing the suppression of dissolution of the tungsten layer, or the like, ease of removal of the carboxylic acid compound itself after surface treatment, and the ability to remove other foreign substances (impurities including organic residues and the like), the number of nitrogen atoms is preferably 2 to 6, more preferably 2 to 4, and particularly preferably 3 or 4.

The number of carboxyl groups in the carboxylic acid compound according to the present invention is not particularly limited as long as it is one or more, however, for balancing the suppression of dissolution of the tungsten layer, or the like, and the ease of removal of the carboxylic acid compound itself after surface treatment, it is preferably 1 to 10, more preferably 2 to 8, still more preferably 3 to 7, particularly preferably 4 to 6, and most preferably 5 or 6.

Among them, the carboxylic acid compound included in the composition for surface treatment is preferably a compound represented by the following Formula (1), or a salt thereof:

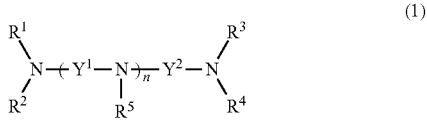

wherein $Y^1$ and $Y^2$ each independently represent an unsubstituted or substituted, straight chain or branched chain alkylene group having 1 to 5 carbon atoms, n is an integer of 0 to 4, and $R^1$ to $R^5$ each independently represent a hydrogen atom, or an unsubstituted or substituted, straight chain or branched chain alkyl group having 1 to 5 carbon atoms, where one or more of $R^1$ to $R^5$ represent an alkyl group substituted with a carboxyl group.

In the present description, for the alkyl group or the alkylene group, the term "unsubstituted or substituted" refers to one or more hydrogen atoms of the substituent being unsubstituted or substituted with other substituents. Here, the substitutable substituent is not particularly limited. For example, the substituents such as a fluorine atom (F); a chlorine atom (Cl); a bromine atom (Br); an iodine atom (I); a phosphonic acid group (—$PO_3H_2$); a phosphoric acid group (—$OPO_3H_2$); a sulfonic acid group (—$SO_3H$); a thiol group (—SH); a cyano group (—CN); a nitro group (—$NO_2$); a hydroxyl group (—OH); a carboxyl group (—$CO_2H$); a straight chain or branched chain alkoxy group having 1 to 10 carbon atoms (e.g., methoxy group, ethoxy group, propoxy group, isopropoxy group, butoxy group, pentyloxy group, hexyloxy group, 2-ethylhexyloxy group, octyloxy group, dodecyloxy group, and the like); an aryl group having 6 to 30 carbon atoms (e.g., phenyl group, biphenyl group, 1-naphthyl group, 2-naphthyl group); a cycloalkyl group having 3 to 20 carbon atoms (e.g., cyclopropyl group, cyclobutyl group, cyclopentyl group, cyclohexyl group, cycloheptyl group) may be listed.

In the above Formula (1), the unsubstituted or substituted, straight chain or branched chain alkylene group having 1 to 5 carbon atoms as $Y^1$ and $Y^2$ is not particularly limited, and includes a straight chain or branched chain alkylene group such as a methylene group, an ethylene group, a trimethylene group, a tetramethylene group, or a propylene group. Among them, an unsubstituted or substituted, straight chain or branched chain alkylene group having 1 to 4 carbon atoms is preferred, and an unsubstituted or substituted, straight chain or branched chain alkylene group having 1 to 3 carbon atoms is more preferred. In addition, from the viewpoint of balancing the effect of suppressing tungsten dissolution and the like, ease of availability, and the ability to remove other foreign substances (impurities including organic residues and the like), $Y^1$ and $Y^2$ are more preferably an ethylene group or a trimethylene group, and particularly preferably an ethylene group. In addition, here, the substituent with which the alkylene group as $Y^1$ and $Y^2$ may be substituted is preferably a hydroxyl group.

In the above Formula (1), n represents the number of (—$Y^1$—$N(R^5)$—), which is an integer of 0 to 4. From the viewpoint of balancing the effect of suppressing tungsten dissolution and the like, ease of availability and the ability to remove other foreign substances (impurities including organic residues and the like), n is preferably an integer of 0 to 2, particularly preferably 1 or 2. When n is 2 or more, n (—$Y^1$—$N(R^5)$—)'s (a plurality of (—$Y^1$—$N(R^5)$—)'s) may be identical or different from each other.

In the above Formula (1), the unsubstituted or substituted, straight chain or branched chain alkyl group having 1 to 5 carbon atoms as $R^1$ to $R^5$ is not particularly limited, and includes an alkyl group such as a methyl group, an ethyl group, a propyl group, an isopropyl group, a butyl group, an isobutyl group, a sec-butyl group, or a tert-butyl group. Among them, $R^1$ to $R^5$ are preferably an unsubstituted or substituted, straight chain or branched chain alkyl group having 1 to 4 carbon atoms, and more preferably an unsubstituted or substituted, straight chain or branched chain alkyl group having 1 to 3 carbon atoms. In addition, from the viewpoint of an effect of suppressing tungsten dissolution and the like, or ease of availability, a methyl group or an ethyl group is more preferred, and a methyl group is particularly preferred. In addition, here, the substituent with which the alkyl group as $R^1$ to $R^5$ may be substituted is preferably a hydroxyl group or a carboxyl group.

In the above Formula (1), one or more of $R^1$ to $R^5$ are an alkyl group substituted with a carboxyl group (a straight chain or branched chain alkyl group having 1 to 5 carbon atoms, substituted with a carboxyl group).

The terms "alkyl group substituted with a carboxyl group" refers to a straight chain or branched chain alkyl group having 1 to 5 carbon atoms, substituted with one or more carboxyl groups, and for example, may include a (mono) carboxymethyl group (—$CH_2CO_2H$), a (mono)carboxyethyl group, a (mono)carboxy-n-propyl group, a (mono)carboxyisopropyl group, a (mono)carboxy-n-butyl group, a (mono) carboxyisobutyl group, a (mono)carboxy-sec-butyl group, a (mono)carboxy-tert-butyl group, a dicarboxymethyl group, a dicarboxyethyl group, a dicarboxy-n-propyl group, a dicarboxyisopropyl group, a dicarboxy-n-butyl group, a dicarboxyisobutyl group, a dicarboxy-sec-butyl group, a dicarboxy-tert-butyl group, and the like. When the substituent has two or more carboxyl groups, each carboxyl group may be substituted on the same carbon atom or on the different carbon atoms.

Among them, the alkyl group substituted with a carboxyl group as $R^1$ to $R^5$ is preferably a straight chain or branched chain alkyl group having 1 to 4 carbon atoms, substituted with 1 or 2 carboxyl groups, and more preferably a straight chain or branched chain alkyl group having 1 to 3 carbon atoms, substituted with 1 or 2 carboxyl groups. In addition, from the viewpoint of an effect of suppressing tungsten dissolution and the like, or ease of availability, a (mono) carboxymethyl group, a (mono)carboxyethyl group, a dicarboxymethyl group or a dicarboxyethyl group is more preferred, a (mono) carboxymethyl group or a dicarboxyethyl group is more preferred, and a (mono)carboxymethyl group is particularly preferred.

In the above Formula (1), it is preferred that four or more of $R^1$ to $R^5$ are an alkyl group substituted with a carboxyl group. Such an embodiment further improves an effect of suppressing tungsten dissolution and the like. In addition, from the viewpoint of further improving an effect of suppressing tungsten dissolution and the like, it is preferred that all of $R^1$ to $R^4$ are a straight chain or branched chain alkyl group having 1 to 5 carbon atoms, substituted with a carboxyl group, and it is particularly preferred that all of $R^1$ to $R^4$ and n $R^5$'s ($R^1$ to $R^4$ and a plurality of $R^5$'s) are a straight chain or branched chain alkyl group having 1 to 5 carbon atoms, substituted with a carboxyl group.

In the composition for surface treatment according to an embodiment of the present invention, the carboxylic acid compound which is particularly preferably used may include ethylenediamine tetraacetic acid, ethylenediamine tetrapropionic acid, 1,3-propanediaminetetraacetic acid, 1,3-diamino-2-hydroxypropanetetraacetic acid, (S,S)-ethylenediminedisuccinic acid, diethylenetriamine pentaacetic acid, and triethylenetetramine hexaacetic acid, and an ammonium salt, a potassium salt, a sodium salt, and a lithium salt thereof. That is, it is preferred that the carboxylic acid compound according to the present invention includes at least one selected from the group consisting of the above carboxylic acid compound and the salt thereof. Specifically, it is preferred that the carboxylic acid compound includes at least one of the compounds represented by the following formulae:

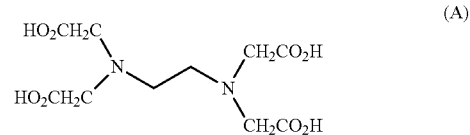

(A)

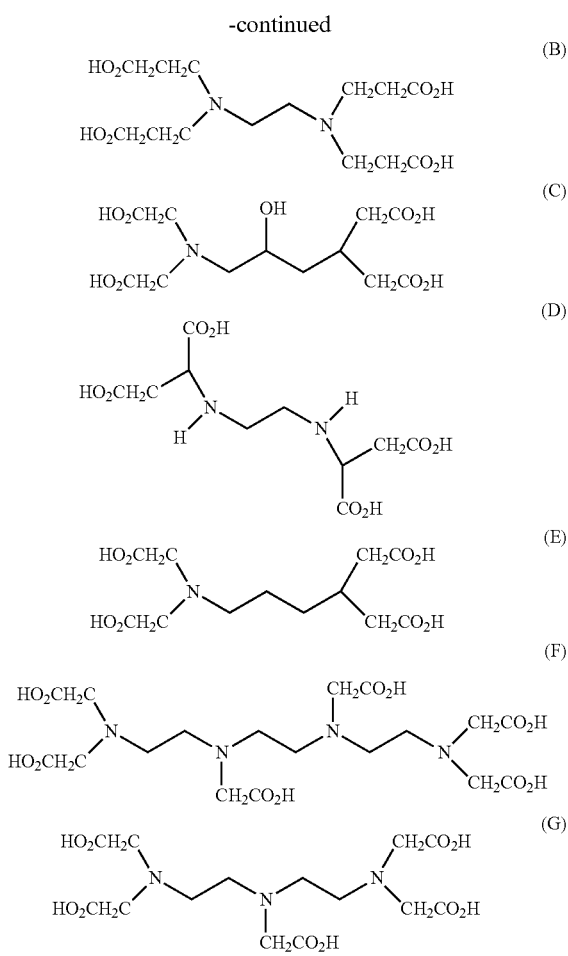

Among them, from the viewpoint of balancing the effect of suppressing the dissolution of tungsten layer and the like, ease of removal of the carboxylic acid compound itself after surface treatment, and the ability to remove other foreign substances (impurities including organic residues and the like), it is more preferred that the carboxylic acid compound includes at least one selected from the group consisting of 1,3-propanediaminetetraacetic acid (Compound (E)), 1,3-diamino-2-hydroxypropanetetraacetic acid (Compound (C)), (S,S)-ethylenediaminedisuccinic acid (Compound (D)), diethylenetriaminepentaacetic acid (Compound (G)), and triethylenetetraminehexaacetic acid (Compound (F)), and an ammonium salt, potassium salt, sodium salt, and lithium salt of these acids (i.e., the group consisting of Compounds (C)-(G), and an ammonium salt, potassium salt, sodium salt and lithium salt of these acids). The carboxylic acid compound may be used alone or in combination of two or more thereof.

The content of the carboxylic acid compound (if two or more are included, the total amount thereof) is not particularly limited; however, it is preferably 0.01% by mass or more, relative to the total mass of the composition for surface treatment. When the content of the carboxylic acid compound is 0.01% by mass or more, an effect of suppressing the dissolution of a tungsten layer and the like is improved.

From the same viewpoint, the content of the carboxylic acid compound (if two or more are included, the total amount thereof) is preferably 0.02% by mass or more, more preferably 0.05% by mass or more, still more preferably 0.06% by mass or more, and particularly preferably 0.08% by mass or more, relative to the total mass of the composition for surface treatment. In addition, the content of the carboxylic acid compound is preferably 5% by mass or less, relative to the total mass of the composition for surface treatment. When the content of the carboxylic acid compound is 5% by mass or less, it is easy to remove the carboxylic acid compound itself after surface treatment. From the same viewpoint, the content of the carboxylic acid compound is more preferably 3% by mass or less, still more preferably 1% by mass or less, particularly preferably less than 1% by mass, and most preferably 0.5% by mass or less, relative to the total mass of the composition for surface treatment.

In addition, the mass ratio of the carboxylic acid compound and an ionic dispersing agent as described below is not particularly limited; however, preferably 10:90 to 90:10. The mass ratio within this range allows the effect of suppressing the dissolution of a tungsten layer and the like to be sufficiently obtained, and the ability to remove foreign substances (impurities including organic residues and the like) to be improved. In addition, from the same viewpoint, the mass ratio (carboxylic acid compound:ionic dispersing agent) is preferably 30:70 to 70:30, and more preferably 40:60 to 60:40.

It is preferred that the carboxylic acid compound has a molecular weight of less than 1,000. The molecular weight of less than 1,000 is preferred, since in the process of removing the carboxylic acid compound after surface treatment of the polished object, the removal of the carboxylic acid compound would became easy. From the same viewpoint, the carboxylic acid compound has a molecular weight of more preferably 800 or less, and particularly preferably 600 or less. Meanwhile, the lower limit of the molecular weight of the carboxylic acid compound is not particularly limited, but 100 or more is preferred. The molecular weight of the carboxylic acid compound can be measured by mass spectroscopy (MS) such as gas chromatography-mass spectroscopy (GC-MS) and HPLC-tandem quadrupole mass spectroscopy; high performance liquid chromatography (HPLC), or the like.

[pH]

The composition for surface treatment according to an embodiment of the present invention has a pH of less than 6. When the pH is less than 6, formation of tungsten hydrate can be suppressed, and dissolution of the tungsten layer can be further suppressed. Meanwhile, when the pH is 6 or more, tungsten hydrate is easily formed, so that the tungsten layer is dissolved. In addition, from the viewpoint of further suppressing the dissolution of the tungsten layer, the composition for surface treatment has more preferably a pH of 4 or less, still more preferably a pH of less than 4, still more preferably a pH of 3 or less, particularly preferably a pH of less than 3, and most preferably a pH of 2.5 or less. In addition, it is preferred that pH is 1 or more. At a pH of 1 or more, the amount of acid to be added for adjusting pH can be reduced, which is preferred for cost reduction.

In addition, as described in detail below, the composition for surface treatment having a pH of less than 6 (that is, acidic) allows the surface of the polished object or the surface of the foreign substance to be positively charged, and obtains an effect of sufficiently removing foreign substances by electrostatic repulsion.

The pH of the composition for surface treatment can be measured by a pH meter (manufactured by HORIBA, Ltd., product name: LAQUA (registered trademark)).

When adjusting the pH, the components other than the essential components of the composition for surface treatment according to an embodiment of the present invention may cause foreign substances, and thus, it is preferred not to add other components as much as possible. Therefore, it is preferred to prepare the composition for surface treatment only with the carboxylic acid compound, the ionic dispersing agent, water, and the acid. However, when it is difficult to obtain the desired pH only with the essential components, other additives such as alkaline component which can be arbitrarily added may be used, to the extent that the effect of the present invention is not impaired.

[Dispersing Medium]

The composition for surface treatment according to an embodiment of the present invention includes water as a dispersing medium (solvent). The dispersing medium has a function of dispersing or dissolving each component. The dispersing medium is not particularly limited as long as it contains water, or it may be only water. In addition, the dispersing medium may be a mixed solvent of water and an organic solvent, for dispersing or dissolving each component. In this case, the example of the organic solvent to be used includes acetone, acetonitrile, ethanol, methanol, isopropanol, glycerin, ethylene glycol, propylene glycol, and the like which are organic solvents miscible with water. In addition, these organic solvents may be used without being mixed with water to disperse or dissolve each component, and then mixed with water. These organic solvents may be used alone or in combination of two or more thereof. Among them, it is preferred that the dispersing medium is only water.

It is preferred that water does not contain impurities as much as possible, from the viewpoint of inhibiting contamination of the cleaning object (the object to be cleaned) or a function of other components. For example, it is preferred that water has a total content of transition metal ions of 100 ppb by mass or less. Here, the purity of water can be increased by removal of impurity ions using an ion exchange resin, removal of foreign substances by a filter, or operation such as distillation. Specifically, it is preferred to use for example, deionized water (ion exchange water), pure water, ultrapure water, distilled water, or the like, as water.

[Ionic Dispersing Agent]

The composition for surface treatment according to an embodiment of the present invention includes an ionic dispersing agent. The "ionic dispersing agent" refers to a polymer having a functional group which is ionized in the dispersing medium (liquid temperature of 25° C.). In addition, "polymer" refers to a polymer (polymerized material) having a weight average molecular weight of 1,000 or more. The weight average molecular weight is measured by gel permeation chromatography (GPC), specifically following the method described in the Examples.

The ionic dispersing agent may include an anionic dispersing agent, a cationic dispersing agent, and an amphoteric dispersing agent. These ionic dispersing agents may be used alone or in combination of two or more thereof. Among them, it is preferred that the ionic dispersing agent contains the anionic dispersing agent, for improving an effect of suppressing the dissolution of the tungsten layer.

The example of the anionic dispersing agent may include, a polymer compound having a sulfonic acid (salt) group, a polymer compound having a phosphoric acid (salt) group, a polymer compound having a phosphonic acid (salt) group, and a polymer compound having a carboxylic acid (salt).

In the present description, "sulfonic acid (salt) group" refers to "sulfonic acid group" or "sulfonic acid salt group", "phosphoric acid (salt) group" refers to "phosphoric acid group" or "phosphoric acid salt group", "phosphonic acid (salt) group" refers to "phosphonic acid group" or "phosphonic acid salt group", and "carboxylic acid (salt) group" refers to "carboxylic acid group (carboxyl group)" or "carboxylic acid salt group". The anionic dispersing agent may be used alone or in combination of two or more thereof.

Among them, a polymer compound having a sulfonic acid (salt) group (sulfonic acid (salt) group-containing polymer) is preferred, from the viewpoint of having a high effect of suppressing the dissolution of tungsten, and also, excellent ability to remove foreign substances (impurities including organic residues and the like). That is, it is preferred that the ionic dispersing agent is a polymer compound having a sulfonic acid (salt) group. The polymer compound having a sulfonic acid (salt) group (herein also simply referred to as "sulfonic acid group-containing polymer") is adsorbed on the surface of a tungsten layer together with the carboxylic acid compound, thereby further increasing the effect of further suppressing the dissolution of the tungsten layer. In addition, the sulfonic acid group-containing polymer contributes to removal of foreign substances by the composition for surface treatment. Therefore, the composition for surface treatment including the sulfonic acid group-containing polymer can sufficiently remove foreign substances (impurities including organic residues and the like) remaining on the surface of the polished object, in surface treatment (such as cleaning) of the polished object.

The sulfonic acid group-containing polymer can form micelles by the affinity of the portion other than the sulfonic acid (salt) group (that is, the polymer chain portion of the sulfonic acid group-containing polymer) and a foreign substance (in particular a hydrophobic component). Therefore, it is considered that these micelles are dissolved or dispersed in the composition for surface treatment, thereby also effectively removing the foreign substance which is a hydrophobic component.

In addition, when the surface of the polished object is cationic under the acidic condition, the sulfonic acid group is anionized, so that the sulfonic acid group-containing polymer becomes easy to adsorb on the surface of the polished object. As a result, it is considered that the sulfonic acid group-containing polymer is in a state of covering the surface of the polished object. Meanwhile, since the sulfonic acid group of the sulfonic acid group-containing polymer is easily adsorbed on the residual foreign substance (in particular, one being easily cationic), the surface of the foreign substance becomes anionic. Therefore, the foreign substance of which the surface becomes anionic and the anionized sulfonic acid group of the sulfonic acid group-containing polymer adsorbed on the surface of the polished object electrostatically repel each other. In addition, in the case that the foreign substance is anionic, the foreign substance itself and the anionized sulfonic acid group present on the polished object electrostatically repel each other. Therefore, it is considered that by using this electrostatic repulsion, the foreign substance can be effectively removed.

In addition, when the polished object is difficult to charge, it is assumed that the foreign substance is removed by a mechanism different from the above. First, it is considered that the foreign substance (in particular a hydrophobic component) is likely to be adhered to the hydrophobic polished object by hydrophobic interaction. Here, the polymer chain portion (hydrophobic structural portion) of the sulfonic acid group-containing polymer is oriented to the surface side of the polished object, due to the hydrophobicity, and the anionized sulfonic acid group or the like which is a hydrophilic structural portion is oriented to the side opposite to the surface side of the polished object. It is assumed that the surface of the polished object is thus covered with the anionized sulfonic acid group to become hydrophilic. As a result, it is considered that it becomes difficult to generate hydrophobic interaction between the foreign substance (in particular, the hydrophobic component) and the polished object, thereby suppressing the adhesion of the foreign substance.

Then, the carboxylic acid compound adsorbed on the surface of the polished object and the sulfonic acid group-containing polymer are further subjected to washing with water and the like, thereby being easily removed.

The sulfonic acid group-containing polymer is not particularly limited as long as it has a sulfonic acid (salt) group (sulfonic acid group ($-SO_3H$) or sulfonic acid salt group ($-SO_3M^2$, wherein $M^2$ is an organic or inorganic cation), and a known compound can be used therefore. The example of the sulfonic acid group-containing polymer may include a polymer compound obtained by sulfonating the polymer compound as a starting material, or a polymer compound obtained by (co)polymerizing the monomers having a sulfonic acid (salt) group.

More specifically, the example of the sulfonic acid group-containing polymer may include sulfonic acid (salt) group-containing polyvinyl alcohol (sulfonic acid-modified polyvinyl alcohol), sulfonic acid (salt) group-containing polystyrene such as polystyrene sulfonic acid and sodium polystyrene sulfonate, sulfonic acid (salt) group-containing polyvinylacetate (sulfonic acid-modified polyvinylacetate), sulfonic acid (salt) group-containing polyester, a copolymer of (meth)acryl group-containing monomer-sulfonic acid (salt) group-containing monomer such as a copolymer of (meth)acrylic acid-sulfonic acid (salt) group-containing monomer, and the like. In the present description, the notation "(meth)acryl" represents "acryl" and "methacryl", and the notation "(meth)acrylate" represents "acrylate" and "methacrylate", in the specific name of the compound. The sulfonic acid group-containing polymer may be used alone or in combination of two or more thereof. At least a portion of the sulfonic acid group of these polymers may be in the form of a salt. The example of the salt includes alkali metal salts such as sodium salts and potassium salts, the salts of Group 2 elements such as calcium salts and magnesium salts, amine salts, ammonium salts, and the like. In particular, when the polished object is a semiconductor substrate after a CMP process, an ammonium salt is preferred, from the viewpoint of removing metals on the surface of the substrate as much as possible.

That is, it is preferred that the polymer compound having a sulfonic acid (salt) group according to the present invention includes at least one selected from the group consisting of sulfonic acid group-containing polyvinyl alcohol, sulfonic acid group-containing polystyrene, sulfonic acid group-containing polyvinylacetate, sulfonic acid group-containing polyester, and a copolymer of (meth)acryl group-containing monomer-sulfonic acid group-containing monomer, and the sodium salt, the potassium salt, the calcium salt, the magnesium salt, the amine salt, and the ammonium salt thereof. In addition, it is more preferred that the polymer compound having a sulfonic acid (salt) group according to the present invention includes at least one selected from the group consisting of the sodium salt, the potassium salt, the calcium salt, the magnesium salt, the amine salt, and the ammonium salts of sulfonic acid group-containing polystyrene.

Furthermore, from the viewpoint that the effect of suppressing the dissolution of the tungsten-containing layer is high, it is particularly preferred that the composition for surface treatment according to an embodiment of the present invention includes at least one selected from the group consisting of ethylenediaminetetraacetic acid, ethylenediaminetetrapropionic acid, 1,3-propane diaminetetraacetic acid, 1,3-diamino-2-hydroxy propanetetraacetic acid, (S,S)-ethylenediaminedisuccinic acid, diethylenetriaminepentaacetic acid, and triethylenetetraminehexaacetic acid, and the ammonium salt, the potassium salt, the sodium salts, and the lithium salt thereof, and at least one selected from the group consisting of the sodium salt, the potassium salt, the calcium salt, the magnesium salt, the amine salt, and the ammonium salt of sulfonic acid group-containing polystyrene.

In addition, in the case that the sulfonic acid group-containing polymer is sulfonic acid group-containing polyvinyl alcohol, a saponification degree is preferably 80% or more, and more preferably 85% or more (upper limit of 100%), from the viewpoint of solubility.

In the present invention, it is preferred that the sulfonic acid group-containing polymer has a weight average molecular weight of 1,000 or more. When the weight average molecular weight is 1,000 or more, an effect of removing foreign substances is increased. It is presumed that the reason therefore is that the coatability of the sulfonic acid group-containing polymer to the polished object or foreign substances is better, and an action of removing foreign substances from the surface of the cleaning object, or an action of suppressing redeposition of organic residues on the surface of the polished object is further improved. From the same viewpoint, the weight average molecular weight is more preferably 2,000 or more, and still more preferably 8,000 or more.

In addition, it is preferred that the sulfonic acid group-containing polymer has a weight average molecular weight of 100,000 or less. In the case that the weight average molecular weight is 100,000 or less, the effect of removing foreign substances is increased. It is presumed that the reason therefore is that the removability of the sulfonic acid group-containing polymer after a cleaning step is better. From the same viewpoint, the weight average molecular weight is preferably 50,000 or less, more preferably 30,000 or less, and particularly preferably 20,000 or less.

The weight average molecular weight can be measured by gel permeation chromatography (GPC). The details of measurement of the weight average molecular weight are described in the Examples.

As the sulfonic acid group-containing polymer, a commercially available product may be used, for example, GOHSENX (registered trademark) L-3226 and GOHSENX (registered trademark) CKS-50, manufactured by Nippon Synthetic Chemical Industry Co., Ltd., ARON (registered trademark) A-6012, A-6016 A, and A-6020, manufactured by Toagosei Company, Limited, POLYNASS (registered trademark) PS-1, manufactured by Tosoh Organic Chemical Co., Ltd., and the like may be used.

It is preferred that the content of the sulfonic acid group-containing polymer is 0.01% by mass or more, relative to the total mass of the composition for surface treatment. When the content of the sulfonic acid group-containing polymer is 0.01% by mass or more, the effect of removing foreign substances is further improved. It is presumed that the reason therefore is that when sulfonic acid group-containing polymer coats the polished object and foreign substances, it covers a larger area. Due to this, particularly the foreign substances easily form micelles, and thus, the effect of removing the foreign substances by dissolution/dispersion of the micelles is improved. In addition, it is assumed that as the number of sulfonic acid (salt) groups is increased overall, an electrostatic adsorption or repulsion effect is more strongly expressed, thereby further increasing the effect of removing foreign substances. From the same viewpoint, the content of the sulfonic acid group-containing polymer is preferably 0.03% by mass or more, and more preferably 0.05% by mass or more, relative to the total mass of the composition for surface treatment. In addition, the content of the sulfonic acid group-containing polymer is preferably 5% by mass or less, relative to the total mass of the composition for surface treatment. When the content of the sulfonic acid group-containing polymer is 5% by mass or less, the effect of removing foreign substances is increased. It is presumed that the reason therefore is that the removability of the sulfonic acid group-containing polymer itself after a cleaning step is better. From the same viewpoint, the content of the sulfonic acid group-containing polymer is more preferably 3% by mass or less, still more preferably 1% by mass or less, particularly preferably 0.5% by mass or less, and most preferably 0.1% by mass or less, relative to the total mass of the composition for surface treatment.

In addition, the composition for surface treatment according to an embodiment of the present invention may include other polymer compounds, in addition to the sulfonic acid group-containing polymer. Here, the term "polymer compound" refers to a compound having a weight average molecular weight of 1,000 or more. As the weight average molecular weight, the value measured by the method described in the Examples is adopted.

Here, it is preferred that the content of the sulfonic acid group-containing polymer is more than 80% by mass (upper limit of 100% by mass), relative to the total mass of the polymer compound included in the composition for surface treatment. When the content of the sulfonic acid group-containing polymer is more than 80% by mass, relative to the total mass of the polymer compound included in the composition for surface treatment, the effect of removing foreign substances is further improved. The reason therefore is that the amount of the polymer compound other than the sulfonic acid group-containing polymer which may cause foreign substances after a cleaning step is decreased. In addition, it is assumed that when the sulfonic acid group-containing polymer coats the polished object and foreign substances, the inhibition of coating due to a polymer compound other than the sulfonic acid group-containing polymer is suppressed. From the same viewpoint, it is more preferred that the content of the sulfonic acid group-containing polymer is more than 95% by mass, relative to the total mass of the polymer compound included in the composition for surface treatment. In this case, the effect of removing foreign substances is significantly improved.

In addition, the content of the sulfonic acid group-containing polymer is particularly preferably 100% by mass, relative to the total mass of the polymer compound included in the composition for surface treatment. That is, it is particularly preferred that the polymer compound included in the composition for surface treatment is composed of only the sulfonic acid group-containing polymer. In other words, it is particularly preferable that the polymer compound essentially consists of the sulfonic acid group-containing polymer.

Then, as the "other polymer compound", included in the composition for surface treatment according to an embodiment of the present invention, the polymer compounds used as other additives as described below may be listed.

[Acids]

The composition for surface treatment according to an embodiment of the present invention may further include an acid. In the present description, the sulfonic acid group-containing polymer is regarded as being different from the acid as an additive described herein. The acid is added mainly for adjusting the pH of the composition for surface treatment. As described above, dissolution of tungsten and the like can be suppressed by adjusting the pH of the composition for surface treatment to less than 6 (to be acidic). In addition, it is assumed that when the polished object contains silicon nitride, silicon oxide, or polysilicon, the acid serves to charge the surface of the polished object, or the surface of foreign substances positively. Therefore, by adding the acid, an electrostatic repulsion effect is promoted, so that the effect of removing foreign substances by the composition for surface treatment is further improved.

As the acid, any one of an inorganic acid and an organic acid may be used. The inorganic acid is not particularly limited, but may include, for example, sulfuric acid, nitric acid, boric acid, carbonic acid, hypophosphorous acid, phosphorus acid, phosphoric acid, and the like. The organic acid is not particularly limited, but may include carboxylic acids such as formic acid, acetic acid, propionic acid, butyric acid, valeric acid, 2-methylbutyiric acid, n-hexanoic acid, 3,3-dimethylbutyric acid, 2-ethylbutyric acid, 4-methylpentanoic acid, n-heptanoic acid, 2-methylhexanonic acid, n-octanoic acid, 2-ethylhexoanoic acid, benzoic acid, glycolic acid, salicylic acid, glyceric acid, oxalic acid, malonic acid, succinic acid, glutaric acid, adipic acid, pimelic acid, maleic acid, phthalic acid, malic acid, tartaric acid, citric acid, and lactic acid, and methanesulfonic acid, ethanesulfonic acid, isethionic acid, and the like. These acids may be used alone or in combination of two or more thereof.

Among them, from the viewpoint of having a better effect of charging the surface of the polished object and the surface of foreign substances positively, and enhancing the removability of the foreign substances, maleic acid or nitric acid is more preferred, and maleic acid is still more preferred.

The content of the acid is preferably 0.01% by mass or more, relative to the total mass of the composition for surface treatment. When the content of the acid is 0.01% by mass or more, the effect of removing foreign substances is further improved. It is presumed that the reason therefore is that the effect of charging the surface of the polished object and the surface of the foreign substances positively is improved. From the same viewpoint, the content of the acid is preferably 0.02% by mass or more, and more preferably 0.03% by mass or more, relative to the total mass of the composition for surface treatment. In addition, the content of the acid is preferably 5% by mass or less, relative to the total mass of the composition for surface treatment. The content of the acid being 5% by mass or less is preferred for reducing costs. From the same viewpoint, the content of the acid is preferably 3% by mass or less, and more preferably 1% by mass or less, relative to the total mass of the composition for surface treatment.

[Other Additives]

The composition for surface treatment according to an embodiment of the present invention may include other additives, if necessary, at an arbitrary ratio, to the extent that the effect of the present invention is not impaired. However, the component other than the essential components of the composition for surface treatment according to an embodiment of the present invention may cause a foreign substance, it is preferred not to add it as much as possible. Therefore, the amount of the component other than the essential components to be added is preferably as low as possible, and it is more preferred not to include the component. Other additives may include, for example, abrasive grains, alkalis, antiseptic agents, dissolving gas, reducing agents, oxidizing agents, alkanol amines, and the like. Among them, for further improving the effect of removing foreign substances, it is preferred that the composition for surface treatment does not contain abrasive grains substantially. Here, "not containing abrasive grains substantially" refers to the case that the content of the abrasive grains is 0.01% by mass or less, relative to the total mass of the composition for surface treatment.

[Effect of Suppressing Dissolution of Tungsten Layer]

It is more preferred that the composition for surface treatment according to an embodiment of the present invention has a higher effect of suppressing dissolution of the tungsten layer of the polished object. Besides, it is more preferred that the composition for surface treatment according to an embodiment of the present invention has a higher effect of suppressing an increase of the surface roughness of the polished object.

For the effect of suppressing the dissolution of the tungsten layer, it is more preferred that an etching rate of the tungsten layer is lower, when subjecting the polished object to surface treatment using the composition for surface treatment. Specifically, when subjecting the polished object to surface treatment using the composition for surface treatment, the dissolved film thickness per 30 minutes is preferably 30 Å (3 nm; 10 Å=1 nm, hereinafter the same) or less, more preferably 20 Å (2 nm) or less, particularly preferably 10 Å (1 nm) or less, and most preferably less than 10 Å (1 nm). Meanwhile, since a lower etching rate is more preferred, the lower limit is not particularly limited; however, the dissolved film thickness per 30 minutes is substantially 0.1 Å (0.01 nm).

As the etching rate, the value measured by the method described in the Examples, after performing the surface treatment by the method described in the Examples, is adopted.

[Effect of Removing Foreign Substances]

It is more preferred that the composition for surface treatment according to an embodiment of the present invention has a higher effect of removing foreign substances on the surface of the polished object. That is, when performing surface treatment of the polished object using the composition for surface treatment, the smaller number of foreign substances remaining on the surface is more preferred. Specifically, when subjecting the polished object to surface treatment using the composition for surface treatment, the number of foreign substances is preferably 6000 or less, more preferably 3000 or less, still more preferably 2000 or less, particularly preferably 1500 or less, and most preferably 250 or less. Meanwhile, since the smaller number of foreign substances is more preferred, the lower limit thereof is not particularly limited; however, it is substantially 100.

As the number of foreign substances, the value measured by the method described in the Examples, after performing the surface treatment by the method described in the Example, is adopted.

<Method for Preparing Composition for Surface Treatment>

A method for preparing the composition for surface treatment is not particularly limited. For example, the composition can be prepared by mixing the carboxylic acid compound having two or more nitrogen atoms, the ionic dispersing agent, and water. That is, according to another embodiment of the present invention, a method for preparing the composition for surface treatment, including mixing a carboxylic acid compound having two or more nitrogen atoms, an ionic dispersing agent, and water, is also provided. The type, the amount to be added and the like of the carboxylic acid compound and the ionic dispersing agent are as described above. In addition, in the method for preparing the composition for surface treatment according to an embodiment of the present invention, the acid, other additives, a dispersing medium other than water and the like may be further mixed, if necessary. The type, the amount to be added and the like thereof are as described above.

The order of addition and the method of addition of each of the components are not particularly limited. Each of the materials may be added all together or separately, stepwise or continuously. In addition, the mixing method is not particularly limited, and a known method may be used. Preferably, the method for preparing the composition for surface treatment includes sequentially adding a carboxylic acid compound having two or more nitrogen atoms and an ionic dispersing agent, and stirring them in water. Besides, the method for preparing the composition for surface treatment may include measuring and adjusting a pH of the composition for surface treatment so that the pH is less than 6.

<Polished Object>

In the present invention, a polished object (also referred to as "cleaning object" in the present description) has a tungsten-containing layer. Here, "a polished object having tungsten-containing layer" may be any form as long as it has the surface to be polished which includes tungsten. Therefore, the polished object may be a substrate formed of tungsten, or a substrate having a tungsten-containing layer or a layer formed of tungsten (for example, a substrate having a tungsten-containing layer or a layer formed of tungsten arranged on the substrate of a polymer or another metal). Preferably, the polished object is a polished object (e.g., substrate) having a layer formed of tungsten. That is, it is preferred that the composition for surface treatment according to an embodiment of the present invention is used for surface treatment (cleaning and the like) of the polished object having a layer formed of tungsten.

In addition, in the present description, the polished object refers to a polishing object (an object to be polished) after being polished in the polishing step. As the polishing step, although it is not particularly limited, a CMP process is preferred.

The composition for surface treatment according to an embodiment of the present invention can effectively reduce the foreign substances remaining on the surface of the polished object including silicon nitride, silicon oxide, or polysilicon, together with the tungsten-containing layer. The polished object including silicon oxide may include, for example, a polished object having tetraethyl orthosilicate (TEOS) type silicon oxide surface (hereinafter, also simply referred to as "TEOS"), produced by using tetraethyl orthosilicate as a precursor, high density plasma (HDP) film, undoped silicate glass (USG) film, phosphorus silicate glass (PSG) film, boron-phospho silicate glass (BPSG) film, rapid thermal oxidation (RTO) film, and the like.

The polished object is preferably a polished semiconductor substrate, and more preferably a semiconductor substrate after CMP. Here, foreign substances or the roughness of a surface may cause the performance degradation of a semiconductor device. Therefore, when the polished object is a polished semiconductor substrate, it is required to reduce the foreign substances or the roughness of the surface as much as possible, in the cleaning step of the semiconductor substrate. The composition for surface treatment according to an embodiment of the present invention has a sufficient effect of removing foreign substances. Therefore, it can be preferably used in this surface treatment (cleaning and the like) of the polished semiconductor substrate.

The specific example of this polished object includes a polished semiconductor substrate having a structure in which a silicon nitride film or a silicon oxide film is formed on tungsten, and a polished semiconductor substrate having a structure in which a tungsten portion, a silicon nitride film, and a silicon oxide film are all exposed.

Here, from the viewpoint of the effect of the present invention, the composition for surface treatment according to an embodiment of the present invention is preferably used in the surface treatment of the polished object including a tungsten-containing layer, and silicon nitride, silicon oxide, or polysilicon. The polished object including silicon nitride, silicon oxide, or polysilicon is required to strictly remove foreign substances, in the manufacture of a semiconductor device. Since the composition for surface treatment according to an embodiment of the present invention has a sufficient ability to remove the foreign substances, it can sufficiently meet such requirements.

<Method for Surface Treatment>

Another embodiment of the present invention is a method for surface treatment, including subjecting a polished object having a tungsten-containing layer to surface treatment, using the composition for surface treatment. Still another embodiment of the present invention is a method for surface treatment, including subjecting a polished object including a tungsten-containing layer, and silicon nitride, silicon oxide, or polysilicon to surface treatment by using the composition for surface treatment. In the present description, a method for surface treatment refers to a method for reducing foreign substances on the surface of a polished object, which is a method for performing cleaning in a broad sense.

According to the method for surface treatment according to an embodiment of the present invention, remaining foreign substances can be sufficiently removed, while dissolution of a tungsten-containing layer is suppressed. That is, according to another embodiment of the present invention, a method for reducing foreign substances on the surface of a polished object, including subjecting a polished object having a tungsten-containing layer to surface treatment by using the composition for surface treatment.

The method for surface treatment according to an embodiment of the present invention is performed by bringing the composition for surface treatment into direct contact with a polished object.

The method for surface treatment may mainly include (I) a method by rinse polishing treatment, and (II) a method by cleaning treatment. That is, it is preferred that the surface treatment according to an embodiment of the present invention is performed by rinse polishing or cleaning. The rinse polishing treatment and the cleaning treatment are carried out in order to remove foreign substances (particles, metal contaminants, organic residues, pad debris, and the like) on the surface of a polished object, thereby obtaining a clean surface. The above (I) and (II) are described below.

(I) Rinse Polishing Treatment

The composition for surface treatment according to an embodiment of the present invention is preferably used in the rise polishing treatment. The rinse polishing treatment is performed on a polishing table (platen) equipped with a polishing pad, for the purpose of removing the foreign substances on the surface of the polishing object, after last polishing (final polishing) is performed for the polishing object. Here, the composition for surface treatment according to an embodiment of the present invention is brought into direct contact with the polished object, thereby performing the rinse polishing treatment. As a result, the foreign substances on the surface of the polished object are removed by frictional force (physical action) by the polishing pad, and chemical action by the composition for surface treatment. Among the foreign substances, in particular, particles or organic residues are easily removed by physical action. Therefore, in the rinse polishing treatment, particles and organic residues can be effectively removed by using friction with the polishing pad on the polishing table (platen).

Specifically, the rinse polishing treatment is performed by providing the surface of the polished object (the polished semiconductor substrate) after a polishing step on the polishing table (platen) of a polishing apparatus, bringing the polishing pad and the polished object into contact with each other, and sliding the polished object and the polishing pad relatively to each other, while supplying the composition for surface treatment (rinse polishing composition) to the contact portion thereof.

The rinse polishing treatment can be performed by using any one of a single-side polishing apparatus and a double-side polishing apparatus. In addition, it is preferred that the polishing apparatus is provided with a discharge nozzle of a polishing composition, and also the discharge nozzle of a rinse polishing composition. The operation condition during the rinse polishing treatment of the polishing apparatus is not particularly limited, and can be appropriately set by a person skilled in the art.

(II) Cleaning Treatment

The composition for surface treatment according to an embodiment of the present invention is preferably used in cleaning treatment. The cleaning treatment is performed for the purpose of removing foreign substances on the surface of a polishing object, after last polishing (final polishing) is performed on the polishing object, or the rinse polishing treatment is performed. Then, the cleaning treatment and the rinse polishing treatment are classified depending on the place where these treatments are performed. The cleaning treatment is surface treatment which is performed after separating the polished object from a polishing table (platen). In the cleaning treatment also, the composition for surface treatment according to an embodiment of the present invention is brought into direct contact with the polished object, thereby removing the foreign substance on the surface of the object.

The method of performing cleaning treatment includes, for example, (i) a method in which a cleaning brush is brought into contact with one side or both sides of a polished object with the polished object being held, and a surface of the cleaning object is rubbed with the cleaning brush while supplying the composition for surface treatment to the contact portion of the surface of the cleaning object and the cleaning brush, or (ii) a method in which a polished object is dipped in the composition for surface treatment, and ultrasonic treatment or stirring (dip type) is performed. In each of these methods, the foreign substances on the surface of the polishing object are removed by frictional force caused by a cleaning brush, or mechanical force generated by ultrasound treatment or stirring, and chemical action by the composition for surface treatment.

In the above method (i), the method of bring the composition for surface treatment (cleaning composition) into contact with a polished object is not particularly limited; however, may include, for example, a spin type method in which the polished object is rotated at high speed while the composition for surface treatment is flowed from a nozzle onto the polished object, a spray type method in which the composition for surface treatment is sprayed on the polished object, and the like.

For more efficiently removing contaminants within a short time, it is preferred that the spin type method or the spray type method is adopted as the cleaning treatment, and the spin type method is more preferred.

The apparatus for performing this cleaning treatment may include, for example, a batch type cleaning apparatus for subjecting simultaneously a plurality of polished objects housed in a cassette to surface treatment, a single-wafer (sheet) type cleaning apparatus for surface treatment of one polished object mounted on a holder, and the like. Among them, from the viewpoint of shortening a cleaning time, it is preferred to use the single-wafer (sheet) type cleaning apparatus.

In addition, the apparatus for performing cleaning treatment may include, for example, a polishing apparatus having a cleaning facility, which rubs the object with a cleaning brush after separating the polished object from a polishing table (platen). By using this polishing apparatus, the cleaning treatment of the polished object can be more efficiently performed.

As this polishing apparatus, a general polishing apparatus having a holder for holding the polished object, a motor capable of changing the number of rotations, a cleaning brush, and the like can be used. As the polishing apparatus, either of a single-side polishing apparatus or a double-side polishing apparatus can be used. When a rinse polishing step is performed after a CMP process, it is more efficient and preferred that the cleaning treatment is performed using the same apparatus as the polishing apparatus used in the rinse polishing step.

The cleaning brush is not particularly limited; however, a brush made of resin is preferably used. The material of the brush made of resin is not particularly limited; however, it is preferred to use, for example, polyvinyl alcohol (PVA). As the cleaning brush, it is particularly preferred to use a sponge made of PVA.

The cleaning condition is not particularly limited, and can be appropriately set depending on the type of cleaning object, and the type and amount of the organic residues to be removed. For example, the number of rotations of the cleaning brush is preferably from 10 rpm (0.17 $s^{-1}$; 60 rpm=1 $s^{-1}$, hereinafter the same) to 200 rpm (3.3 $s^{-1}$). The number of rotations of the cleaning object is preferably from 10 rpm (0.17 $s^{-1}$) to 100 rpm (1.7 $s^{-1}$). The pressure applied to the cleaning object (polishing pressure) is preferably from 0.5 psi (3.4 kPa; 1 psi=6894.76 Pa, hereinafter the same) to 10 psi (68.9 kPa). The method of supplying the composition for surface treatment to the polishing pad is not particularly limited, and for example, a method of continuously supplying (flowing) the composition with a pump and the like can be adopted. The supply amount is not limited; however, it is preferred that the cleaning brush and the surfaces of the cleaning object are always covered with the composition for surface treatment, and 10 mL/min to 5000 mL/min is preferred. The cleaning time is not particularly limited, but for the process using the composition for surface treatment according to an embodiment of the present invention, 5 seconds to 180 seconds is preferred. Within this range, it is possible to effectively remove foreign substances.

The temperature of the composition for surface treatment during cleaning is not particularly limited, and generally it may be room temperature (25° C.), but the composition may be heated to about 40° C. to 70° C. to the extent that the performance is not impaired In the above method (ii), the conditions of the cleaning method by dipping are not particularly limited, and a known method can be used.

Before, after or both before and after performing the cleaning treatment by the above methods (i) or (ii), cleaning by water may be performed.

In addition, it is preferred that the polished object (cleaning object) after being cleaned is dried by removing water droplets adhering to the surface with a spin dryer or the like. In addition, the surface of the cleaning object may be dried by air blow drying.

<Method for Producing Semiconductor Substrate>

The method for surface treatment according to an embodiment of the present invention is preferably applied, when the polished object is a polished semiconductor substrate having a tungsten-containing layer. That is, according to an embodiment of the present invention, there is also provided a method for producing a semiconductor substrate, in which the polished object is a polished semiconductor substrate having a tungsten-containing layer, the method includes subjecting the polished semiconductor substrate to surface treatment using the composition for surface treatment.

The details of the semiconductor substrate to which the production method is applied, are as described for the polished object which is subjected to surface treatment with the composition for surface treatment.

In addition, the method for producing a semiconductor substrate is not particularly limited, as long as it includes subjecting the surface of the polished semiconductor substrate having a tungsten layer to surface treatment using the composition for surface treatment according to an embodiment of the present invention (surface treatment step). The production method may include, for example, a method including a polishing step for forming a polished semiconductor substrate having a tungsten layer, and a cleaning step. In addition, as another example, the production method may include a polishing step and a cleaning step and a rinse polishing step between the polishing step and the cleaning step. Hereinafter, each step is described.

[Polishing Step]

The polishing step which can be included in the method for producing a semiconductor substrate is a step of polishing a semiconductor substrate to form a polished semiconductor substrate.

The polishing step is not particularly limited as long as it is a step in which a semiconductor substrate is polished, however, it is preferred that the polishing step is a chemical mechanical polishing (CMP) process. In addition, the polishing step may be a polishing step consisting of a single process, or a polishing step consisting of a plurality of processes. The polishing step consisting of a plurality of processes may include, for example, performing a stock polishing step (rough polishing step) and then a final polishing step, performing a primary polishing step, and then one time or two or more times of a secondary polishing step, and thereafter, a final polishing step, and the like. It is preferred that a surface treatment step using the composition for surface treatment according to an embodiment of the present invention is performed after the final polishing step.

As the polishing composition, a known polishing composition can be appropriately used depending on the properties of the semiconductor substrate. The polishing composition is not particularly limited; however, for example, a composition containing abrasive grains, an acid salt, a dispersing medium and an acid may be preferably used. The specific example of this polishing composition includes a polishing composition containing sulfonic acid-modified colloidal silica, ammonium sulfate, water, and maleic acid, and the like.

As the polishing apparatus, a general polishing apparatus equipped with a holder for holding a polishing object, a motor capable of changing the number of rotations and the like, and having a polishing table to which a polishing pad (polishing cloth) is attachable, can be used. As the polishing apparatus, either of a single-side polishing apparatus or a double-side polishing apparatus can be used.

As the polishing pad, common nonwoven fabric, polyurethane, porous fluorine resin, or the like can be used without limitation. It is preferred that the polishing pad is subjected to groove processing to retain a polishing solution.

The polishing condition is not particularly limited, and for example, the number of rotations of a polishing table (platen), and the number of rotations of a head (carrier) are preferably 10 rpm to 100 rpm. In addition, the pressure applied to a polishing object (polishing pressure) is preferably 0.5 psi (3.4 kPa) to 10 psi (68.9 kPa). The method of supplying a polishing composition to a polishing pad is also not particularly limited, and for example, a method of continuously supplying (flowing) the composition with a pump or the like can be adopted. The supply amount is not limited; however, it is preferred that the surface of the polishing pad is always covered with the polishing composition, and 10 mL/min to 5000 mL/min is preferred. The polishing time is not particularly limited, but for the process using the polishing composition, 5 seconds to 180 seconds is preferred.

[Surface Treatment Step]

A surface treatment step refers to a step of reducing foreign substances on the surface of a polished object using the composition for surface treatment according to an embodiment of the present invention. In the method for producing a semiconductor substrate, a cleaning step as the surface treatment step may be performed after a rinse polishing step, or only a rinse polishing step or only a cleaning step may be performed.

(Rinse Polishing Step)

A rinse polishing step may be provided between a polishing step and a cleaning step, in the method for producing a semiconductor substrate. The rinse polishing step is a step of reducing foreign substances on the surface of the polished object (polished semiconductor substrate), by the method for surface treatment (rinse polishing treatment method) according to an embodiment of the present invention.

For the apparatus such as a polishing apparatus and a polishing pad, and the polishing conditions, the same apparatus and conditions as those of the polishing step, can be applied, except for supplying the composition for surface treatment according to an embodiment of the present invention instead of supplying the polishing composition.

The details of the rinse polishing method used in the rinse polishing step are as described for the rinse polishing treatment.

(Cleaning Step)

A cleaning step may be provided after the polishing step, or after the rinse polishing step, in the method for producing a semiconductor substrate. The cleaning step is a step of reducing foreign substances on the surface of the polished object (polished semiconductor substrate), by the method for surface treatment (cleaning method) according to an embodiment of the present invention.

The details of the cleaning method used in the cleaning step are as described for the cleaning method.

Although the embodiments of the present invention have been described in detail, it is illustrative and exemplary, but not restrictive, and it is apparent that the scope of the present invention should be interpreted by the appended claims.

The present invention includes the following embodiments and forms:

1. A composition for surface treatment, comprising: a carboxylic acid compound having two or more nitrogen atoms, an ionic dispersing agent, and water, wherein the composition has a pH of less than 6, and is used for treating a surface of a polished object having a tungsten-containing layer;

2. The composition for surface treatment described in 1., wherein the carboxylic acid compound is a compound represented by the following Formula (1), or a salt thereof:

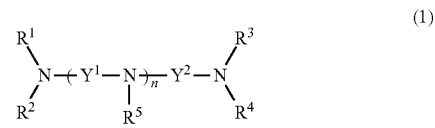

(1)

wherein
$Y^1$ and $Y^2$ each independently represent an unsubstituted or substituted, straight chain or branched chain alkylene group having 1 to 5 carbon atoms,
n is an integer of 0 to 4, and
$R^1$ to $R^5$ each independently represent a hydrogen atom, or an unsubstituted or substituted, straight chain or branched chain alkyl group having 1 to 5 carbon atoms, where one or more of $R^1$ to $R^5$ represent an alkyl group substituted with a carboxyl group;

3. The composition for surface treatment described in 2., wherein in Formula (1), four or more of $R^1$ to $R^5$ represent an alkyl group substituted with a carboxyl group;

4. The composition for surface treatment described in any one of 1. to 3., wherein the carboxylic acid compound comprises at least one selected from the group consisting of ethylenediaminetetraacetic acid, ethylenediaminetetrapropionic acid, 1,3-propanediaminetetraacetic acid, 1,3-diamino-2-hydroxypropanetetraacetic acid, (S,S)-ethylenediaminedisuccinic acid, diethylenetriaminepentaacetic acid, and triethylenetetraminehexaacetic acid, and an ammonium salt, a potassium salt, a sodium salt, and a lithium salt thereof;

5. The composition for surface treatment described in any one of 1. to 4., wherein the carboxylic acid compound has three or more nitrogen atoms;

6. The composition for surface treatment described in any one of 1. to 5., wherein the composition has a pH of 4 or less;

7. The composition for surface treatment described in any one of 1. to 6., wherein the composition does not substantially comprise abrasive grains;

8. The composition for surface treatment described in any one of 1. to 7., wherein the ionic dispersing agent is a polymer compound having a sulfonic acid group or a sulfonic acid salt group;

9. A method for preparing the composition for surface treatment described in any one of 1. to 8., comprising mixing a carboxylic acid compound having two or more nitrogen atoms, an ionic dispersing agent, and water;

10. A method for surface treatment, comprising subjecting a polished object having a tungsten-containing layer to surface treatment by using the composition for surface treatment described in any one of 1. to 8.; and 11. The method for surface treatment described in 10., wherein the surface treatment is performed by rinse polishing or cleaning.

EXAMPLES

The present invention is described in more detail using the following Examples and Comparative Examples. However, the technical scope of the present invention is not limited only to the following Examples. In addition, unless otherwise particularly stated, "%" and "part" refer to "% by mass" and "part by mass", respectively.

<Measurement of Weight Average Molecular Weight>

As the weight average molecular weight of the materials used in the Examples, a value of a weight average molecular weight value (in terms of polyethylene glycol) measured by gel permeation chromatography (GPC) was used. The weight average molecular weight was measured by the following apparatus and conditions:

GPC apparatus: product manufactured by Shimadzu Corporation
Model: Prominence
Column: Shim-pack (registered trademark) VP-ODS (manufactured by Shimadzu GLC Ltd.)
Mobile phase A: MeOH
B: a 1% aqueous solution of acetic acid
Flow rate: 1 mL/min
Detector: evaporative light scattering detector (ELSD), detector (ELSD-LTII) temp. 40° C., Gain 8, $N_2$ GAS 350 kPa
Oven temperature: 40° C.
Injection amount: 40 µL.

<Preparation of Composition for Surface Treatment>

Example 1: Preparation of Composition for Surface Treatment A-1

0.33 parts by mass of an aqueous maleic acid solution having a concentration of 30% by mass (0.1 parts by mass of maleic acid) as the organic acid, 0.1 parts by mass of 1,3-diamino-2-hydroxypropanetetraacetic acid as the dissolution inhibitor, 0.1 parts by mass of sodium polystyrene sulfonate (weight average molecular weight of 12,000) as the ionic dispersing agent, and water (deionized water) in an amount to total 100 parts by mass were mixed, thereby preparing the composition for surface treatment A-1. The pH of the composition for surface treatment A-1 (liquid temperature: 25° C.) measured by a pH meter (manufactured by HORIBA, Ltd., product name: LAQUA (registered trademark), hereinafter, the same apparatus was used for pH measurement) was 2.0.

Examples 2 to 5: Preparation of Compositions for Surface Treatment A-2 to A-5

Each of the compositions for surface treatment A-2 to A-5 was prepared in the same manner as in Example 1, except that 1,3-diamino-2-hydroxypropanetetraacetic acid as the dissolution inhibitor was changed to the compounds described in Table 1. The pH of each composition for surface treatment (liquid temperature: 25° C.) measured by the pH meter is shown in Table 1.

Comparative Example 1: Preparation of Composition for Surface Treatment C-1

Composition for surface treatment C-1 was prepared in the same manner as in Example 1, except that sodium polystyrene sulfonate as the ionic dispersing agent was not added. The pH of the composition for surface treatment C-1 (liquid temperature: 25° C.) measured by the pH meter was 2.0. In addition, "-" indicated in the following Table 1 represents that the corresponding component was not used (hereinafter the same).

Comparative Example 2: Preparation of Composition for Surface Treatment C-2

Composition for surface treatment C-2 was prepared in the same manner as in Example 2, except that sodium polystyrene sulfonate as the ionic dispersing agent was not added. The pH of the composition for surface treatment C-2 (liquid temperature: 25° C.) measured by the pH meter was 2.1.

Comparative Example 3: Preparation of Composition for Surface Treatment C-3

Composition for surface treatment C-3 was prepared in the same manner as in Example 3, except that sodium polystyrene sulfonate as the ionic dispersing agent was not added. The pH of the composition for surface treatment C-3 (liquid temperature: 25° C.) measured by the pH meter was 2.1.

Comparative Examples 4 and 5: Preparation of Composition for Surface Treatment C-4 and C-5

Each of the compositions for surface treatment C-4 and C-5 was prepared in the same manner as in Example 1, except that 1,3-diamino-2-hydroxypropanetetraacetic acid as the dissolution inhibitor was changed to the compounds described in the following Table 1. The pH of each composition for surface treatment (liquid temperature: 25° C.) measured by the pH meter is shown in Table 1.

Comparative Example 6: Preparation of Composition for Surface Treatment C-6

Composition for surface treatment C-6 was prepared in the same manner as in Example 1, except that the dissolution inhibitor and the ionic dispersing agent were not added. The pH of the composition for surface treatment C-6 (liquid temperature: 25° C.) measured by the pH meter was 2.0.

Comparative Example 7: Preparation of Composition for Surface Treatment C-7

Composition for surface treatment C-7 was prepared in the same manner as in Example 1, except that sodium polystyrene sulfonate as the ionic dispersing agent was changed to polyoxyethylenealkylether (manufactured by DKS Co. Ltd., NOIGEN (registered trademark) ET-165). The pH of the composition for surface treatment C-7 (liquid temperature: 25° C.) measured by the pH meter was 2.1.

<Evaluation: Measurement of Tungsten Etching Rate>

As an indicator of the effect of suppressing dissolution of a tungsten layer, the etching test was performed by the following operation. That is, in a sample vessel in which 300 mL of each composition for surface treatment was stirred at 300 rpm, a tungsten wafer (size: 32 mm×32 mm) was immersed at 60° C. for 10 minutes. After the immersion, the tungsten wafer was cleaned with pure water for 30 seconds, and dried by air blow drying with an air gun. The thicknesses of the tungsten wafer (film thickness) before and after the etching test were measured by a sheet resistance measuring apparatus (VR-120, manufactured by Hitachi Kokusai Electric Inc.). The etching rate (Å/min) was determined by dividing a difference between the thicknesses of the tungsten wafer (film thicknesses) obtained before and after the etching test, by an etching test time, as described below (Calculation method of etching rate). In Table 1, the etching rate which was converted into that per 30 minutes (Å/30 minutes) is presented.

(Calculation Method of Etching Rate)

An etching rate (Å/min) was calculated by the following Equation (1).

$$\text{Etching rate (Å/min)} = \frac{[\text{Film thickness (Å) of cleaning object before etching}] - [\text{Film thickness (Å) of cleaning object after etching}]}{\text{Etching time (min)}} \quad \text{Equation (1)}$$

<Evaluation: Evaluation of Number of Foreign Substances>

(Preparation of Polished Object (Cleaning Object))

A polished silicon nitride substrate after being polished by the following chemical mechanical polishing (CMP) process was prepared as the polished object (cleaning object, also referred to as polished substrate).

The silicon nitride substrate which is a semiconductor substrate was polished using the polishing composition M (composition: 4% by mass of sulfonic acid-modified colloidal silica (prepared by the method described in "Sulfonic acid-functionalized silica through quantitative oxidation of thiol groups", Chem. Commun. 246-247(2003), primary particle diameter of 30 nm, secondary particle diameter of 60 nm), 1% by mass of ammonium sulfate, 0.018% by mass of an aqueous maleic acid solution having a concentration of 30% by mass, solvent: water), under each of the following conditions. Here, a 300 mm wafer was used as the silicon nitride substrate:

—Polishing Apparatus and Polishing Conditions—

Polishing apparatus: product manufactured by Ebara Corporation, F-REX300E

Polishing pad: product manufactured by Nitta Haas Incorporated, hard polyurethane pad IC1010

Polishing pressure: 2.0 psi (13.8 kPa) (1 psi=6894.76 Pa, hereinafter the same)

Number of rotations of polishing table: 60 rpm
Number of rotations of head: 60 rpm
Supplying method of polishing composition: flowing
Supply amount of polishing composition: 300 mL/min
Polishing time: for 60 minutes.

<<Cleaning Step>>

After polishing the surface of the wafer in the CMP process, the wafer was separated from the polishing table (platen). Subsequently, in the same polishing apparatus, each polished substrate was cleaned, by the cleaning method in which the wafer was sandwiched between the upper and the lower portions of a sponge made of polyvinyl alcohol (PVA) as the cleaning brush, and each polished substrate was rubbed with pressure applied thereto under the following conditions, using each composition for surface treatment (cleaning composition) as prepared above:

—Cleaning Apparatus and Cleaning Conditions—

Apparatus: product manufactured by Ebara Corporation, F-REX300E

Number of rotations of cleaning brush: 100 rpm
Number of rotations of cleaning object (polished substrate): 50 rpm
Flow rate of cleaning solution: 1000 mL/min
Cleaning time: for 60 seconds.

<<Measurement of Number of Foreign Substances>>

For the cleaned substrate after being cleaned by the above cleaning step, the number of foreign substances was measured according to the following procedure. The evaluation results are shown in Table 1.

The number of foreign substances having a size of 0.09 μm or more was measured, after cleaning the polished silicon nitride substrate using each composition for surface treatment under the cleaning condition as described above. Surfscan (registered trademark) SP2 manufactured by KLA TENCOR was used for measuring the number of foreign substances. The measurement was performed for the remaining portion excluding the portion from the outer peripheral end portion to a width of 5 mm on the one side of the cleaned substrate.

TABLE 1

| | Inhibitor (carboxylic acid compound) (parts by mass) | | | |
|---|---|---|---|---|
| | Type | Number of nitrogen atoms | Number of carboxyl groups | M.W. |
| Example 1 | 1,3-diamino-2-hydroxypropanetetraacetic acid (0.1) | 2 | 4 | 322 |
| Example 2 | (S,S)-ethylenediaminedisuccinic acid (0.1) | 2 | 4 | 292 |
| Example 3 | 1,3-propanediaminetetraacetic acid (0.1) | 2 | 4 | 306 |
| Example 4 | triethylenetetraminehexaacetic acid (0.1) | 4 | 6 | 494 |
| Example 5 | diethylenetriaminepentaacetic acid (0.1) | 3 | 5 | 393 |
| Comparative Example 1 | 1,3-diamino-2-hydroxypropanetetraacetic acid (0.1) | 2 | 4 | 322 |
| Comparative Example 2 | (S,S)-ethylenediaminedisuccinic acid (0.1) | 2 | 4 | 292 |
| Comparative Example 3 | 1,3-propanediaminetetraacetic acid (0.1) | 2 | 4 | 306 |
| Comparative Example 4 | dihydroxyethylglycine (0.1) | 1 | 1 | 163 |
| Comparative Example 5 | nitrilotriacetic acid (0.1) | 1 | 3 | 191 |
| Comparative Example 6 | — | — | — | — |
| Comparative Example 7 | 1,3-diamino-2-hydroxypropanetetraacetic acid (0.1) | 2 | 4 | 322 |

| | Acid (parts by mass) | Dispersing agent (parts by mass) | pH | W etching amount (Å/30 min @60° C.) | Number of foreign substances (piece) |
|---|---|---|---|---|---|
| Example 1 | maleic acid (0.1) | sodium polystyrene sulfonate (0.1) | 2.0 | 7.07 | 111 |
| Example 2 | maleic acid (0.1) | sodium polystyrene sulfonate (0.1) | 2.1 | 7.40 | 103 |
| Example 3 | maleic acid (0.1) | sodium polystyrene sulfonate (0.1) | 2.1 | 8.56 | 204 |
| Example 4 | maleic acid (0.1) | sodium polystyrene sulfonate (0.1) | 2.1 | 8.41 | 155 |

TABLE 1-continued

| | | | | | |
|---|---|---|---|---|---|
| Example 5 | maleic acid (0.1) | sodium polystyrene sulfonate (0.1) | 2.1 | 9.33 | 188 |
| Comparative Example 1 | maleic acid (0.1) | — | 2.0 | 10.34 | 275 |
| Comparative Example 2 | maleic acid (0.1) | — | 2.1 | 10.14 | 335 |
| Comparative Example 3 | maleic acid (0.1) | — | 2.1 | 12.31 | 289 |
| Comparative Example 4 | maleic acid (0.1) | sodium polystyrene sulfonate (0.1) | 2.0 | 10.02 | 472 |
| Comparative Example 5 | maleic acid (0.1) | sodium polystyrene sulfonate (0.1) | 2.1 | 10.21 | 308 |
| Comparative Example 6 | maleic acid (0.1) | — | 2.0 | 18.00 | 472 |
| Comparative Example 7 | maleic acid (0.1) | polyoxyethylenealkylether (0.1) | 2.1 | 10.12 | 1666 |

It was seen from the results of Table 1 that when using a carboxylic acid compound, but having no two or more nitrogen atoms, the etching rate was increased, so that the tungsten layer was dissolved (Comparative Examples 4 and 5). In addition, it was also found that when using a composition for surface treatment without an ionic dispersing agent, the etching rate was high, so that the tungsten layer was dissolved (Comparative Examples 1 to 3). In addition, when using a non-ionic dispersing agent together with the carboxylic acid compound according to the present invention, the same result was obtained (Comparative Example 7).

However, when using a carboxylic acid compound having two or more nitrogen atoms and an anionic dispersing agent, it was confirmed that dissolution of the tungsten layer was suppressed (Examples 1 to 5).

The present application is based on the Japanese Patent Application No. 2017-179296 filed on Sep. 19, 2017, and the disclosure thereof is entirely incorporated herein by reference.

What is claimed is:

1. A composition for surface treatment, comprising: a carboxylic acid compound having two or more nitrogen atoms, an ionic dispersing agent, and water,
   wherein the composition has a pH of less than 6, and is used for treating a surface of a polished object having a tungsten-containing layer,
   wherein the ionic dispersing agent comprises a sulfonic acid group-containing polymer wherein the sulfonic acid group-containing polymer comprises at least one selected from the group consisting of sulfonic acid group-containing polyvinyl alcohol, sulfonic acid group-containing polystyrene, sulfonic acid group-containing polyvinylacetate, and sulfonic acid group-containing polyester, and the sodium salt, the potassium salt, the calcium salt, the magnesium salt, the amine salt, and the ammonium salt thereof.

2. The composition for surface treatment according to claim 1, wherein the carboxylic acid compound is a compound represented by the following Formula (1), or a salt thereof:

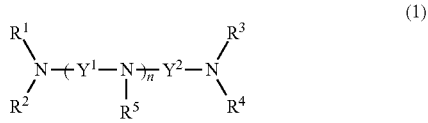

(1)

wherein $Y^1$ and $Y^2$ each independently represent an unsubstituted or substituted, straight chain or branched chain alkylene group having 1 to 5 carbon atoms, n is an integer of 0 to 4, and $R^1$ to $R^5$ each independently represent a hydrogen atom, or an unsubstituted or substituted, straight chain or branched chain alkyl group having 1 to 5 carbon atoms, where one or more of $R^1$ to $R^5$ represent an alkyl group substituted with a carboxyl group.

3. The composition for surface treatment according to claim 2, wherein in Formula (1), four or more of $R^1$ to $R^5$ represent an alkyl group substituted with a carboxyl group.

4. The composition for surface treatment according to claim 1, wherein the carboxylic acid compound comprises at least one selected from the group consisting of ethylenediaminetetraacetic acid, ethylenediaminetetrapropionic acid, 1,3-propanediaminetetraacetic acid, 1,3-diamino-2-hydroxypropanetetraacetic acid, (S,S)-ethylenediaminedisuccinic acid, diethylenetriaminepentaacetic acid, and triethylenetetraminehexaacetic acid, and an ammonium salt, a potassium salt, a sodium salt, and a lithium salt thereof.

5. The composition for surface treatment according to claim 1, wherein the carboxylic acid compound has three or more nitrogen atoms.

6. The composition for surface treatment according to claim 1, wherein the composition has a pH of 4 or less.

7. The composition for surface treatment according to claim 1, wherein the composition does not substantially comprise abrasive grains.

8. A method for preparing the composition for surface treatment according to claim 1, comprising mixing a carboxylic acid compound having two or more nitrogen atoms, an ionic dispersing agent, and water.

9. A method for surface treatment, comprising subjecting a polished object having a tungsten-containing layer to surface treatment by using the composition for surface treatment according to claim 1.

10. The method for surface treatment according to claim 9, wherein the surface treatment is performed by rinse polishing or cleaning.

* * * * *